(12) United States Patent
Chae et al.

(10) Patent No.: US 11,239,872 B2
(45) Date of Patent: Feb. 1, 2022

(54) SIGNAL RECEIVER AND METHOD OF MEASURING OFFSET OF SIGNAL RECEIVER

(71) Applicant: SK hynix Inc., Gyeonggi-do (KR)

(72) Inventors: Joo-Hyung Chae, Gyeonggi-do (KR); Dae Han Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/083,602

(22) Filed: Oct. 29, 2020

(65) Prior Publication Data
US 2021/0367634 A1    Nov. 25, 2021

(30) Foreign Application Priority Data
May 21, 2020  (KR) .................. 10-2020-0060861

(51) Int. Cl.
| | | |
|---|---|---|
| H04L 25/34 | (2006.01) | |
| H04L 25/49 | (2006.01) | |
| H04B 1/12 | (2006.01) | |
| H03K 5/24 | (2006.01) | |
| H04B 1/16 | (2006.01) | |
| H03K 3/037 | (2006.01) | |

(Continued)

(52) U.S. Cl.
CPC ............ *H04B 1/126* (2013.01); *H03K 3/037* (2013.01); *H03K 5/02* (2013.01); *H03K 5/24* (2013.01); *H04B 1/16* (2013.01); *H04L 7/0045* (2013.01)

(58) Field of Classification Search
CPC . H04B 1/126; H04B 1/16; H03K 5/24; H03K 3/013; H03K 3/037; H03K 5/02; H04L 7/0045; H04L 25/03057; H04L 25/03063; H04L 25/03267; H04L 7/033; H03F 3/08
USPC ............... 375/287, 286, 324, 340, 348, 346
See application file for complete search history.

(56) References Cited

U.S. PATENT DOCUMENTS

| | | | |
|---|---|---|---|
| 8,457,190 B2 | 6/2013 | Raghavan et al. | |
| 9,350,572 B1* | 5/2016 | Kang | ............... H04L 7/033 |
| 9,584,346 B2* | 2/2017 | Francese | ........... H04L 25/03063 |

(Continued)

OTHER PUBLICATIONS

Stojanovic et al.. Autonomous Dual-Mode (PAM2/4) Serial Link Transceiver With Adaptive Equalization and Data Recovery, IEEE Journal of Solid-State Circuits, Apr. 2005, p. 1012-p. 1026, vol. 40, IEEE.

(Continued)

*Primary Examiner* — Phuong Phu
(74) *Attorney, Agent, or Firm* — IP & T Group LLP (57) ABSTRACT

A signal receiver includes a first preliminary receiver circuit suitable for receiving an input signal and generating a first preliminary reception signal based on a first reference voltage, a second preliminary receiver circuit suitable for receiving the input signal and generating a second preliminary reception signal based on a second reference voltage, a reception circuit suitable for selecting one of the first preliminary reception signal and the second preliminary reception signal in response to a voltage level of a reception signal and generating the reception signal using the selected signal, and a reference voltage generation circuit suitable for adjusting a voltage level of the first reference voltage based on a first offset and adjusting a voltage level of the second reference voltage based on a second offset.

27 Claims, 5 Drawing Sheets

(51) Int. Cl.
H04L 7/00 (2006.01)
H03K 5/02 (2006.01)

(56) References Cited

U.S. PATENT DOCUMENTS

| | | | | |
|---|---|---|---|---|
| 10,326,623 | B1* | 6/2019 | Tajalli | H04L 25/03267 |
| 10,785,072 | B2* | 9/2020 | Hormati | H04L 25/03057 |
| 11,115,246 | B2* | 9/2021 | Hormati | H04L 25/03063 |
| 2012/0224621 | A1* | 9/2012 | Stojanovic | H04L 25/03057 |
| | | | | 375/233 |
| 2013/0241622 | A1* | 9/2013 | Zerbe | H03K 3/013 |
| | | | | 327/323 |
| 2015/0222236 | A1* | 8/2015 | Takemoto | H03F 3/08 |
| | | | | 250/214 A |

OTHER PUBLICATIONS

Palermo, ECEN720: High-Speed Links Circuits and Systems, Spring 2019, Analog & Mixed-Signal Center, Texas A&M University.

* cited by examiner

SIGNAL RECEIVER AND METHOD OF MEASURING OFFSET OF SIGNAL RECEIVER

CROSS-REFERENCE TO RELATED APPLICATION

This application claims priority under 35 U.S.C. § 119 to Korean Patent Application No. 10-2020-0060861 filed on May 21, 2020, which is incorporated herein by reference in its entirety.

BACKGROUND

1. Field

Various embodiments relate to a signal receiver, and more particularly, to a technology for receiving a signal (e.g., data) in an integrated circuit.

2. Discussion of the Related Art

As performance of electrical systems, such as a computer and a memory, is improved, a data rate becomes higher. However, the limited bandwidth of a channel causes concerns in that inter symbol interference (IST) distorts the original data and reduced margin in voltage and time limit the performance of a signal receiver.

In order to compensate for a signal loss occurring in high-speed signal transmission, an equalizer is used in a signal receiver. A decision feedback equalizer (DFE) is used to correct distortion attributable to ISI by feeding back previously received data.

An offset may occur in the signal receiver due to a process, voltage and temperature (PVT) variation. An accurate operation of the signal receiver may be guaranteed by accurately measuring an offset of the signal receiver and compensating for the offset.

SUMMARY

Various embodiments are directed to a technology for measuring an offset of a signal receiver.

In an embodiment, a signal receiver may include a first preliminary reception circuit suitable for receiving an input signal and generating a first preliminary reception signal based on a first reference voltage; a second preliminary reception circuit suitable for receiving the input signal and generating a second preliminary reception signal based on a second reference voltage; a reception circuit suitable for selectively outputting one of the first preliminary reception signal and the second preliminary reception signal as a reception signal, based on a voltage level of the reception signal corresponding to the input signal received in a previous cycle; and a reference voltage generation circuit suitable for adjusting a level of the first reference voltage based on a first offset and adjusting a level of the second reference voltage based on a second offset, wherein the first offset is measured based on a logic level of the reception signal making a transition from "1" to "0", and the second offset is measured based on a logic level of the reception signal making a transition from "0" to "1."

In an embodiment, a method of measuring an offset of a signal receiver may include generating an input signal having a first level higher than a level of a first reference voltage; comparing the input signal having the first level with the first reference voltage and generating a first preliminary reception signal as a result of the comparison; comparing the input signal having the first level with a second reference voltage and generating a second preliminary reception signal as a result of the comparison; selecting the first preliminary reception signal among the first preliminary reception signal and the second preliminary reception signal and generating a logic level of a reception signal as "1" based on the selected first preliminary reception signal; generating the input signal having a second level lower than the first level; comparing the input signal having the second level with the first reference voltage and generating the first preliminary reception signal as a result of the comparison; comparing the input signal having the second level with the second reference voltage and generating the second preliminary reception signal as a result of the comparison; selecting the first preliminary reception signal among the first preliminary reception signal and the second preliminary reception signal and generating the logic level of the reception signal as "0" based on the selected first preliminary reception signal; and measuring a first offset using the level of the first reference voltage and the second level.

In an embodiment, a signal receiver may include a first preliminary reception circuit suitable for receiving an input signal and generating a first preliminary reception signal based on a first reference voltage; a second preliminary reception circuit suitable for receiving the input signal and generating a second preliminary reception signal based on a second reference voltage; a reception circuit suitable for selectively outputting one of the first preliminary reception signal and the second preliminary reception signal as a reception signal, based on a voltage level of the reception signal corresponding to the input signal received in a previous cycle; and a reference voltage generation circuit suitable for generating the first and second reference voltages, and, during an offset measurement operation of the first preliminary reception circuit, gradually raising the first reference voltage from a first level, wherein the input signal, during the offset measurement operation of the first preliminary reception circuit, is fixed to a second level higher than the first level, and wherein an offset of the first preliminary reception circuit is measured based on a logic level of the first reference voltage at a timing at which the reception signal makes a transition from "1" to "0".

In an embodiment, a method of measuring an offset of a signal receiver may include generating a first reference voltage having a first level lower than a voltage level of an input signal, comparing the input signal with the first reference voltage having the first level and generating a first preliminary reception signal as a result of the comparison, comparing the input signal with a second reference voltage and generating a second preliminary reception signal as a result of the comparison, selecting the first preliminary reception signal among the first preliminary reception signal and the second preliminary reception signal and generating a logic level of a reception signal as "1" based on the selected first preliminary reception signal, generating the first reference voltage having a second level higher than the first level, comparing the input signal with the first reference voltage having the second level and generating the first preliminary reception signal as a result of the comparison, comparing the input signal with the second reference voltage having a level lower than the second level of the first reference voltage and generating the second preliminary reception signal as a result of the comparison, selecting the first preliminary reception signal among the first preliminary reception signal and the second preliminary reception signal and generating the logic level of the reception signal as "0" based on the selected first preliminary reception signal, and measuring a first offset using the second level and the level of the input signal.

In an embodiment a signal receiver may include a first preliminary reception circuit suitable for receiving an input signal and generating a first preliminary reception signal based on a first reference voltage; a second preliminary reception circuit suitable for receiving the input signal and generating a second preliminary reception signal based on a second reference voltage; a reception circuit suitable for selectively outputting one of the first preliminary reception signal and the second preliminary reception signal as a reception signal, based on a voltage level of the reception signal corresponding to the input signal received in a previous cycle; and a reference voltage generation circuit suitable for: generating, during a normal operation, the first and second reference voltage based on a reference voltage setting code, a difference code, a first offset, and a second offset; measuring, during a first offset measurement operation, the first offset of the first preliminary reception circuit based on a logic level of the reception signal obtained by gradually differentiating a voltage difference between the first reference voltage and the input signal; and measuring, during a second offset measurement operation, the second offset of the second preliminary reception circuit based on a logic level of the reception signal obtained by gradually differentiating a voltage difference between the second reference voltage and the input signal.

DETAILED DESCRIPTION

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or it is clear from the context to be directed to a singular form.

Figure 1:
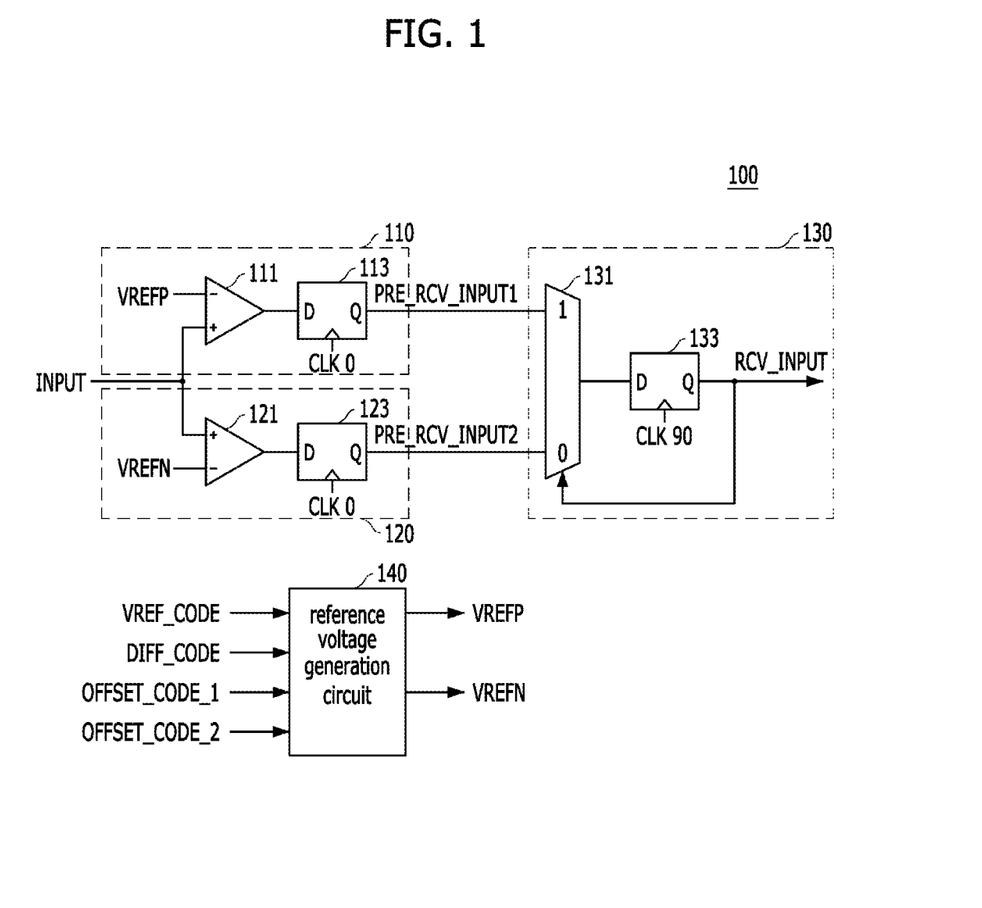
FIG. 1 is a diagram illustrating a signal receiver according to an embodiment of the present invention.

FIG. 1 is a diagram illustrating a signal receiver 100 according to an embodiment the present invention.

Referring to FIG. 1, the signal receiver 100 may include a first preliminary reception circuit 110, a second preliminary reception circuit 120, a reception circuit 130 and a reference voltage generation circuit 140.

The first preliminary reception circuit 110 may receive an input signal INPUT and generate a first preliminary reception signal PRE_RCV_INPUT1 based on a first reference voltage VREFP. The first preliminary reception circuit 110 may include a comparator 111 and a latch 113. The comparator 111 may compare a level of the input signal INPUT with a level of the first reference voltage VREFP. The latch 113 may generate the first preliminary reception signal PRE_RCV_INPUT1 by latching an output signal of the comparator 111 in synchronization with a first clock CLK 0. The latch 113 may include a D flip-flop that operates in synchronization with a rising edge of the first clock CLK 0.

The second preliminary reception circuit 120 may receive the input signal INPUT and generate a second preliminary reception signal PRE_RCV_INPUT2 based on a second reference voltage VREFN. A level of the second reference voltage VREFN may be lower than a level of the first reference voltage VREFP. The second preliminary reception circuit 120 may include a comparator 121 and a latch 123. The comparator 121 may compare a level of the input signal INPUT with a level of the second reference voltage VREFN. The latch 123 may generate the second preliminary reception signal PRE_RCV_INPUT2 by latching an output signal of the comparator 121 in synchronization with the first clock CLK 0. The latch 123 may include a D flip-flop that operates in synchronization with the rising edge of the first clock CLK 0.

The reception circuit 130 may select one of the first preliminary reception signal PRE_RCV_INPUT1 and the second preliminary reception signal PRE_RCV_INPUT2 in response to a reception signal RCV_INPUT that is fed back, and may generate the reception signal RCV_INPUT using the selected signal. The reception circuit 130 may include a selection circuit 131 and a latch 133. The selection circuit 131 may select one of the first preliminary reception signal PRE_RCV_INPUT1 and the second preliminary reception signal PRE_RCV_INPUT2 in response to a level of the reception signal RCV_INPUT. When a logic level of the reception signal RCV_INPUT is "1", the selection circuit 131 may select and output the first preliminary reception signal PRE_RCV_INPUT1. When a logic level of the reception signal RCV_INPUT is "0", the selection circuit 131 may select and output the second preliminary reception signal PRE_RCV_INPUT2. The latch 133 may generate the reception signal RCV_INPUT by latching an output signal of the selection circuit 131 in synchronization with a second clock CLK 90. The second clock CLK 90 may have a phase different from the phase of the first clock CLK 0. For example, the second clock CLK 90 may have a phase lagging behind a phase of the first clock CLK 0 by a phase of 90 degrees. The latch 133 may include a D flip-flop that operates in synchronization with a rising edge of the second clock CLK 90.

The reception signal RCV_INPUT that is fed back may correspond to the input signal INPUT received in a previous cycle prior to the input signal INPUT currently input to the signal receiver 100. When a logic level of the fed back reception signal RCV_INPUT is "1", the reception circuit 130 may select the first preliminary reception signal PRE_RCV_INPUT1. When a logic level of the fed back reception signal RCV_INPUT is "0", the reception circuit 130 may select the second preliminary reception signal PRE_RCV_INPUT2. That is, when a logic level of the input signal INPUT in a previous cycle was "1", the input signal INPUT may be received using the first preliminary reception circuit 110. When a logic level of the input signal INPUT in a previous cycle was "0", the input signal INPUT may be received using the second preliminary reception circuit 120. As a result, when a logic level of the input signal INPUT in a previous cycle was "1", the input signal INPUT may be received using a relatively higher reference voltage (e.g., VREFP). When a logic level of an input signal in a previous cycle was "0", the input signal INPUT may be received using a relatively lower reference voltage (e.g., VREFN).

The reference voltage generation circuit 140 may generate the first reference voltage VREFP and the second reference voltage VREFN. The reference voltage generation circuit 140 may generate the first reference voltage VREFP and the second reference voltage VREFN using a reference voltage setting code VREF_CODE, a difference code DIFF_CODE, a first offset code OFFSET_CODE_1, and a second offset code OFFSET_CODE_2. Each of the codes VREF_CODE, DIFF_CODE, OFFSET_CODE_1, and OFFSET_CODE_2 may have multiple bits. When a voltage value indicated by the reference voltage setting code VREF_CODE is 'VREF' and a voltage value indicated by the difference code DIFF_CODE is 'DIFF', a first reference voltage VREF1 may be generated as 'VREF+DIFF', and a second reference voltage VRFEF2 may be generated as 'VREF−DIFF'. The first offset code OFFSET_CODE_1 may indicate an offset of the first preliminary reception circuit 110. One bit of the first offset code OFFSET_CODE_1 may indicate whether the offset is positive (+) or negative (−), and the remaining bits may indicate a voltage value of the offset. That is, the first offset code OFFSET_CODE_1 may have information of '±OFFSET1'. The second offset code OFFSET_CODE_2 may indicate an offset of the second preliminary reception circuit 120. One hit of the second offset code OFFSET_CODE_2 may indicate whether the offset is positive (+) or negative (−), and the remaining bits may indicate a voltage value of the offset. That is, the second offset code OFFSET_CODE_2 may have information of '±OFFSET2'. When the first reference voltage VREFP is adjusted by the first offset code OFFSET_CODE_1, the first reference voltage VREFP may have a voltage level of 'VREF+DIFF±OFFSET1'. When the second reference voltage VREFN is adjusted by the second offset code OFFSET_CODE_2, the second reference voltage VREFN may have a voltage level of 'VREF−DIFF±OFFSET2'.

The first offset code OFFSET_CODE_1 and the second offset code OFFSET_CODE_2 are used for an accurate operation of the signal receiver 100. The first offset code OFFSET_CODE_1 and the second offset code OFFSET_CODE_2 may be generated only when offsets of the first preliminary reception circuit 110 and the second preliminary reception circuit 120 are accurately generated. A method of measuring offsets of the first preliminary reception circuit 110 and the second preliminary reception circuit 120 is described below.

In a normal operation in which the signal receiver 100 receives the input signal INPUT, the first reference voltage VREFP and the second reference voltage VREFN are generated at different voltage levels. That is, during a normal operation, the first reference voltage VREFP has a higher voltage level than the second reference voltage VREFN. However, during an offset measurement operation to be described later, the first reference voltage VREFP may have a higher voltage level than the second reference voltage VREFN, or the first reference voltage VREFP and the second reference voltage VREFN may have the same voltage level. That is, during the offset measurement operation, a voltage value 'DIFF' indicated by the difference code DIFF_CODE may be '0'.

Figure 2:
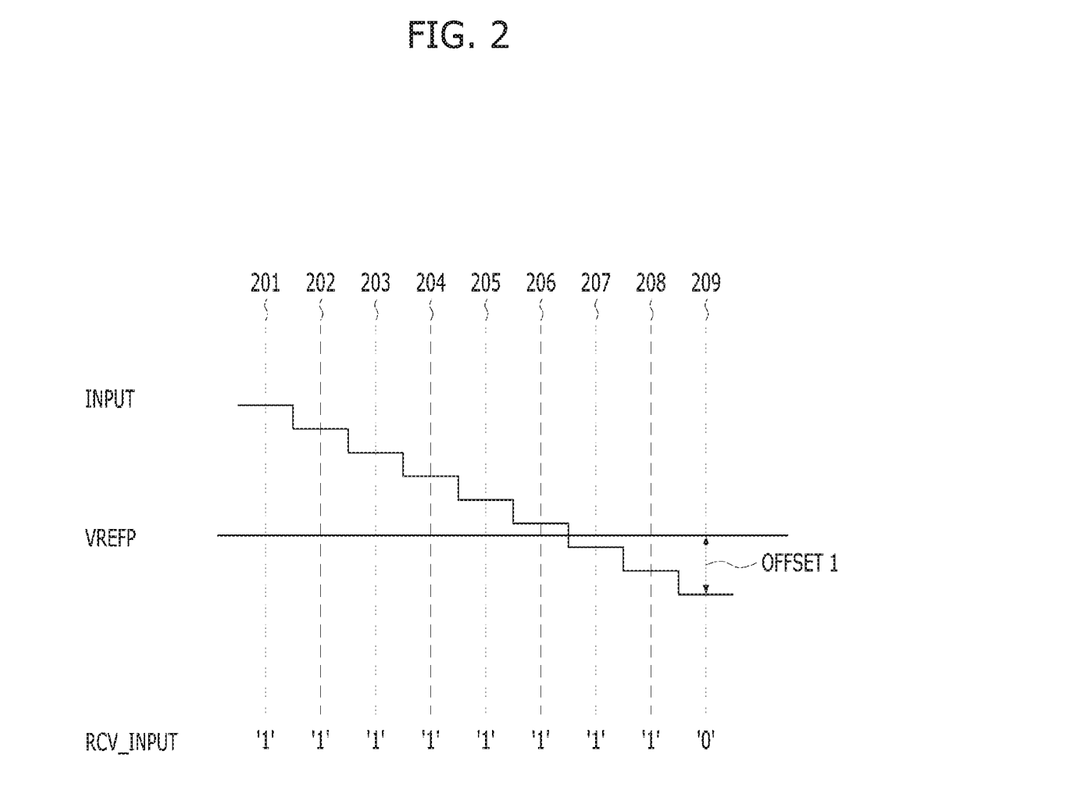
FIGS. 2 and 3 are diagrams for describing an embodiment of a method of measuring offsets of a first preliminary reception circuit and a second preliminary reception circuit shown in FIG. 1.
Figure 3:
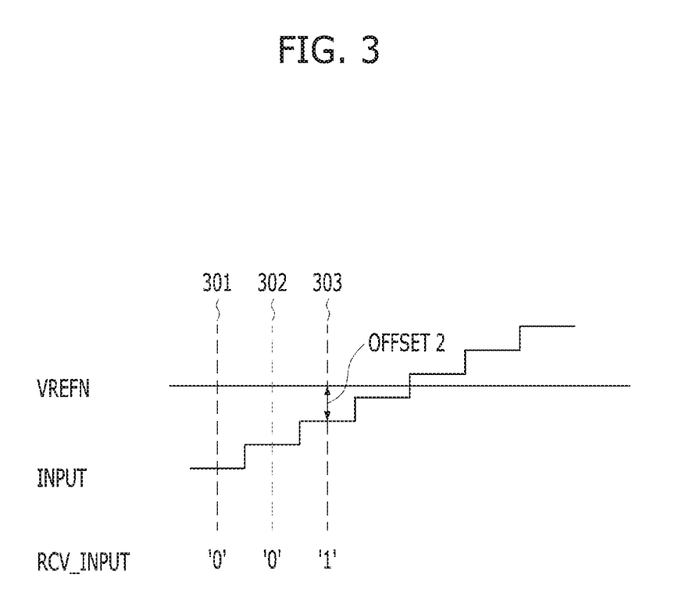

FIGS. 2 and 3 are diagrams for describing an embodiment of a method of measuring offsets of the first preliminary reception circuit 110 and the second preliminary reception circuit 120.

FIG. 2 is a diagram illustrating a process of measuring an offset of the first preliminary reception circuit 110.

An offset of the first preliminary reception circuit 110 may be measured using timings at which a logic level of the reception signal RCV_INPUT makes a transition from "1" to "0", by operating the signal receiver 100 while the input signal INPUT is gradually lowered from a higher voltage level than the first reference voltage VREFP and the level of the first reference voltage VREFP has been fixed. In this case, the offset of the first preliminary reception circuit 110 may be measured because the first preliminary reception circuit 110 is used to receive the input signal INPUT in the signal receiver 100.

Referring to FIG. 2, the first reference voltage VREFP may be fixed to a level of 'VREF+DIFF'. In this state, the input signal INPUT may be gradually lowered from a higher voltage level than the first reference voltage VREFP. At timing "201", a logic level of the reception signal RCV_INPUT may be generated as "1." A logic level of the reception signal RCV_INPUT may be generated as "1" from timing "202" to timing "208." In particular, at the timings "207" and "208", a logic level of the reception signal RCV_INPUT is generated as "1" even though the input signal INPUT has a lower voltage level than the first reference voltage VREFP. This results from an offset of the first preliminary reception circuit 110. At timing "209", a logic level of the reception signal RCV_INPUT may be generated as "0." A difference between the voltage level of the input signal INPUT and the level of the first reference voltage VREFP at the timing "209" at which the logic level of the reception signal RCV_INPUT is generated as "0" may correspond to an offset OFFSET1 of the first preliminary reception circuit 110. In order to compensate for the offset OFFSET1 of the first preliminary reception circuit 110, the first reference voltage VREFP needs to be generated as 'VREF+DIFF+OFFSET1'. In this case, '+OFFSET1' may correspond to the offset of the first preliminary reception circuit 110.

FIG. 3 is a diagram illustrating a process of measuring an offset of the second preliminary reception circuit 120.

An offset of the second preliminary reception circuit 120 may be measured using timings at which a logic level of the reception signal RCV_INPUT makes a transition from "0" to "1", by operating the signal receiver 100 while the input signal INPUT is gradually raised from a lower voltage level than the second reference voltage VREFN and the voltage level of the second reference voltage VREFN has been fixed. In this case, the offset of the second preliminary reception circuit 120 may be measured because the second preliminary reception circuit 120 is used to receive the input signal INPUT in the signal receiver 100.

Referring to FIG. 3, the second reference voltage VREFN may be fixed to a level of 'VREF−DIFF'. In this state, the input signal INPUT may be gradually raised from a lower voltage level than the second reference voltage VREFN. At timings "301" and "302", a logic level of the reception signal RCV_INPUT may be generated as "0." At timing "303", a logic level of the reception signal RCV_INPUT is generated as "1" even though the input signal INPUT has a lower voltage level than the second reference voltage VREFN. This results from an offset of the second preliminary reception circuit 120. A difference between the voltage level of the input signal INPUT and the level of the reference voltage VREFN at the timing "303" at which a logic level of the reception signal RCV_INPUT is generated as "1" may correspond to an offset OFFSET2 of the second preliminary reception circuit 120. In order to compensate for the offset OFFSET2 of the second preliminary reception circuit 120, the second reference voltage VREFN needs to be generated as 'VREF−DIFF+OFFSET2'. In this case, '+OFFSET2' may correspond to the offset of the second preliminary reception circuit 120.

The operations of measuring the offsets of the first preliminary reception circuit 110 and the second preliminary reception circuit 120, illustrated in FIGS. 2 and 3, may be performed when an initialization operation of an integrated circuit including the signal receiver 100 is performed. After the offsets of the first preliminary reception circuit 110 and the second preliminary reception circuit 120 are compensated for based on the results of the measurement, the signal receiver 100 may perform a normal operation. In this case, the normal operation may mean an operation of receiving, by the signal receiver 100, the input signal INPUT after the initialization operation.

Figure 4:
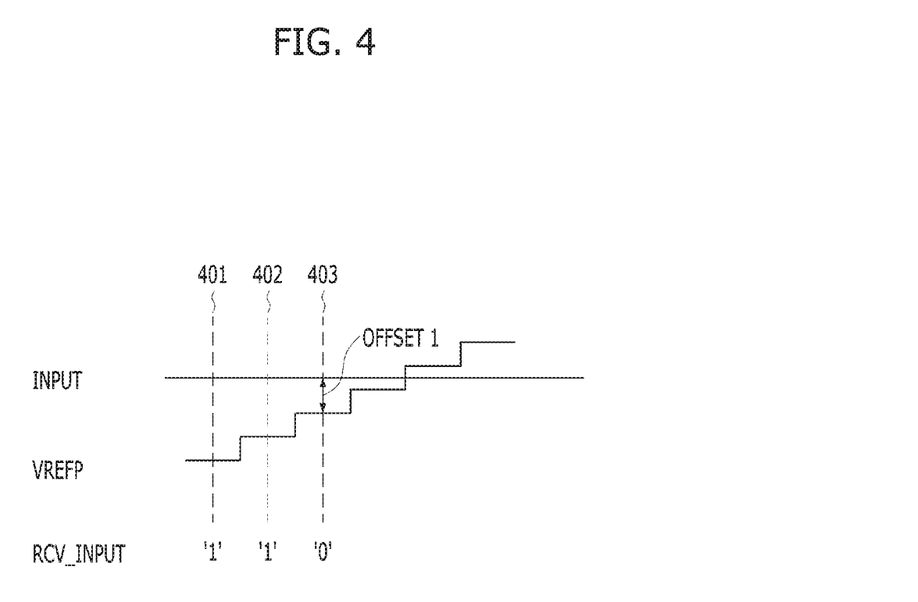
FIGS. 4 and 5 are diagrams for describing another embodiment of a method for measuring offsets of the first preliminary reception circuit and the second preliminary reception circuit shown in FIG. 1.
Figure 5:
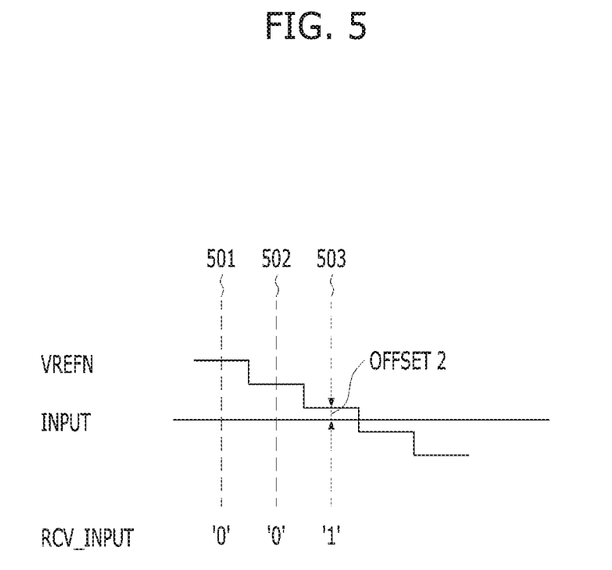

FIGS. 4 and 5 are diagrams for describing another embodiment of a method of measuring offsets of the first preliminary reception circuit 110 and the second preliminary reception circuit 120.

FIG. 4 is a diagram illustrating a process of measuring an offset of the first preliminary reception circuit 110.

An offset of the first preliminary reception circuit 110 may be measured using timings at which a logic level of the reception signal RCV_INPUT makes a transition from "1" to "0", by operating the signal receiver 100 while the first reference voltage VREFP is gradually raised from a lower voltage level than the input signal INPUT corresponding to a logic level "1" and the voltage level of the input signal INPUT has been fixed. In this case, the offset of the first preliminary reception circuit 110 may be measured because the first preliminary reception circuit 110 is used to receive the input signal INPUT in the signal receiver 100.

Referring to FIG. 4, the first reference voltage VREFP may be gradually raised from a low level in the state in which the voltage level of the input signal INPUT has been fixed. At timings "401" and "402", a logic level of the reception signal RCV_INPUT may be generated as "1." At timing "403", a logic level of the reception signal RCV_INPUT is generated as "0" even though the first reference voltage VREFP has a lower voltage level than the input signal INPUT. This results from an offset of the first preliminary reception circuit 110. A difference between the voltage level of the input signal INPUT and the level of the first reference voltage VREFP at the timing "403" at which a logic level of the reception signal RCV_INPUT is generated as "1" may correspond to an offset OFFSET1 of the first preliminary reception circuit 110. In order to compensate for the offset OFFSET1 of the first preliminary reception circuit 110, the first reference voltage VREFP needs to be generated as 'VREF+DIFF−OFFSET1'. In this case, '−OFFSET1' may correspond to the offset of the first preliminary reception circuit 110.

FIG. 5 is a diagram illustrating a process of measuring an offset of the second preliminary reception circuit 120.

An offset of the second preliminary reception circuit 120 may be measured using timings at which a logic level of the reception signal RCV_INPUT makes a transition from "0" to "1", by operating the signal receiver 100 while the second reference voltage VREFN is gradually lowered from a higher voltage level than the input signal INPUT corresponding to a logic level "0", in the state in which the voltage level of the input signal INPUT has been fixed. In this case, the offset of the second preliminary reception circuit 120 may be measured because the second preliminary reception circuit 120 is used to receive the input signal INPUT in the signal receiver 100.

Referring to FIG. 5, the second reference voltage VREFN may be gradually lowered from a high level in the state in which the voltage level of the input signal INPUT has been fixed. At timing "501" and timing "502", a logic level of the reception signal RCV_INPUT may be generated as "0." At timing "503", a logic level of the reception signal RCV_INPUT is generated as "1" even though the second reference voltage VREFN has a higher voltage level than the input signal INPUT. This results from an offset of the second preliminary reception circuit 120. A difference between the voltage level of the input signal INPUT and the level of the second reference voltage VREFN at the timing "503" at which the logic level of the reception signal RCV_INPUT is generated as "1" may correspond to an offset OFFSET2 of the second preliminary reception circuit 120. In order to compensate for the offset OFFSET2 of the second preliminary reception circuit 120, the second reference voltage needs to be generated as 'VREF−DIFF+OFFSET2'. In this case, '+OFFSET2' may correspond to the offset of the second preliminary reception circuit 120.

The operations of measuring the offsets of the first preliminary reception circuit 110 and the second preliminary reception circuit 120, illustrated in FIGS. 4 and 5, may be performed when an initialization operation of an integrated circuit including the signal receiver 100 is performed. After the offsets of the first preliminary reception circuit 110 and the second preliminary reception circuit 120 are compensated for based on the results of the measurement, the signal receiver 100 may perform a normal operation. In this case, the normal operation may mean an operation of receiving, by the signal receiver 100, the input signal INPUT after the initialization operation.

In FIGS. 4 and 5, to lower or raise the voltage levels of the first reference voltage VREFP or the second reference voltage VREFN may be performed by changing the reference voltage setting code VREF_CODE input to the reference voltage generation circuit 140. When a difference between the first reference voltage VREFP and the second reference voltage VREFN is small, the second reference voltage VREFN may become an obstacle in a process of measuring an offset of the first preliminary reception circuit 110, and the first reference voltage VREFP may become an obstacle in a process of measuring an offset of the second preliminary reception circuit 120. Accordingly, a difference between the first reference voltage VREFP and the second reference voltage VREFN during the offset measurement operation may be set to be greater than a difference between the first reference voltage VREFP and the second reference voltage VREFN during the normal operation. In some embodiments, the first reference voltage VREFP and the second reference voltage VREFN may be generated to have the same voltage level.

According to embodiments of the present disclosure, an offset of the signal receiver may be measured.

Although various embodiments have been described for illustrative purposes, it will be apparent to those skilled in the art that various changes and modifications may be made without departing from the spirit and scope of the disclosure as defined in the following claims.

What is claimed is:

1. A signal receiver comprising:
a first preliminary reception circuit suitable for receiving an input signal and generating a first preliminary reception signal based on a first reference voltage;
a second preliminary reception circuit suitable for receiving the input signal and generating a second preliminary reception signal based on a second reference voltage;
a reception circuit suitable for selectively outputting one of the first preliminary reception signal and the second preliminary reception signal as a reception signal, based on a voltage level of the reception signal corresponding to the input signal received in a previous cycle; and
a reference voltage generation circuit suitable for adjusting a level of the first reference voltage based on a first offset and adjusting a level of the second reference voltage based on a second offset,
wherein the first offset is measured based on a logic level of the reception signal making a transition from "1" to "0", and the second offset is measured based on a logic level of the reception signal making a transition from "0" to "1".

2. The signal receiver of claim 1, wherein the first offset is measured based on a voltage level of the input signal at a timing when the logic level of the reception signal is generated as "0" while the input signal is repeatedly applied to the signal receiver while being gradually lowered from a voltage level higher than the first reference voltage.

3. The signal receiver of claim 1, wherein the second offset is measured based on a voltage level of the input signal at timing at which the logic level of the reception signal is generated as "1" while the input signal is repeatedly applied to the signal receiver while being gradually raised from a voltage level lower than the second reference voltage.

4. The signal receiver of claim 1, wherein the reference voltage generation circuit adjusts the level of the first reference voltage and the level of the second reference voltage further using a reference voltage setting code and a difference code.

5. The signal receiver of claim 1,
wherein the first preliminary reception circuit comprises:
a first comparator suitable for comparing the input signal with the first reference voltage; and
a first latch suitable for generating the first preliminary reception signal by latching an output signal of the first comparator, and
wherein the second preliminary reception circuit comprises:
a second comparator suitable for comparing the input signal with the second reference voltage; and
a second latch suitable for generating the second preliminary reception signal by latching an output signal of the second comparator.

6. The signal receiver of claim 5, wherein the reception circuit comprises:
a selection circuit suitable for selecting one of the first preliminary reception signal and the second preliminary reception signal in response to the voltage level of the reception signal corresponding to the input signal received in the previous cycle; and
a third latch suitable for generating the reception signal by latching the signal selected by the selection circuit.

7. The signal receiver of claim 6,
wherein the first latch and the second latch operate in synchronization with a first clock, and
wherein the third latch operates in synchronization with a second clock having a phase lagging behind a phase of the first clock.

8. The signal receiver of claim 1, wherein the first reference voltage has a higher voltage level than the second reference voltage.

9. The signal receiver of claim 1, wherein:
during an offset measurement operation, the first reference voltage and the second reference voltage have an identical voltage level; and
during a normal operation, the first reference voltage has a higher voltage level than the second reference voltage.

10. A method for measuring an offset of a signal receiver, the method comprising:
generating an input signal having a first level higher than a level of a first reference voltage;
comparing the input signal having the first level with the first reference voltage and generating a first preliminary reception signal as a result of the comparison;
comparing the input signal having the first level with a second reference voltage and generating a second preliminary reception signal as a result of the comparison;
selecting the first preliminary reception signal among the first preliminary reception signal and the second preliminary reception signal and generating a logic level of a reception signal as "1" based on the selected first preliminary reception signal;
generating the input signal having a second level lower than the first level;
comparing the input signal having the second level with the first reference voltage and generating the first preliminary reception signal as a result of the comparison;
comparing the input signal having the second level with the second reference voltage and generating the second preliminary reception signal as a result of the comparison;
selecting the first preliminary reception signal among the first preliminary reception signal and the second preliminary reception signal and generating the logic level of the reception signal as "0" based on the selected first preliminary reception signal; and
measuring a first offset using the level of the first reference voltage and the second level.

11. The method of claim 10, further comprising:
generating the input signal having a third level lower than a level of the second reference voltage;

comparing the input signal of the third level with the first reference voltage and generating the first preliminary reception signal as a result of the comparison;
comparing the input signal of the third level with the second reference voltage and generating the second preliminary reception signal as a result of the comparison;
selecting the second preliminary reception signal among the first preliminary reception signal and the second preliminary reception signal and generating the logic level of the reception signal as "0" based on the selected second preliminary reception signal;
generating the input signal having a fourth level higher than the third level;
comparing the input signal of the fourth level with the first reference voltage and generating the first preliminary reception signal as a result of the comparison;
comparing the input signal of the fourth level with the second reference voltage and generating the second preliminary reception signal as a result of the comparison;
selecting the second preliminary reception signal among the first preliminary reception signal and the second preliminary reception signal and generating the logic level of the reception signal as "1" based on the selected second preliminary reception signal; and
measuring a second offset using the level of the second reference voltage and the fourth level.

12. The method of claim 10, wherein the first reference voltage has a higher voltage level than the second reference voltage.

13. The method of claim 10, wherein the first reference voltage and the second reference voltage have an identical voltage level.

14. A signal receiver comprising:
a first preliminary reception circuit suitable for receiving an input signal and generating a first preliminary reception signal based on a first reference voltage;
a second preliminary reception circuit suitable for receiving the input signal and generating a second preliminary reception signal based on a second reference voltage;
a reception circuit suitable for selectively outputting one of the first preliminary reception signal and the second preliminary reception signal as a reception signal, based on a voltage level of the reception signal corresponding to the input signal received in a previous cycle; and
a reference voltage generation circuit suitable for generating the first and second reference voltages, and, during an offset measurement operation of the first preliminary reception circuit, gradually raising the first reference voltage from a first level,
wherein the input signal, during the offset measurement operation of the first preliminary reception circuit, is fixed to a second level higher than the first level, and
wherein an offset of the first preliminary reception circuit is measured based on a logic level of the first reference voltage at a timing at which the reception signal makes a transition from "1" to "0".

15. The signal receiver of claim 14, wherein, during an offset measurement operation of the second preliminary reception circuit:
the reference voltage generation circuit gradually lowers the second reference voltage from a third level;
the input signal is fixed to a fourth level lower than the third level; and
an offset of the second preliminary reception circuit is measured based on a logic level of the second reference voltage at a timing at which the reception signal makes a transition from "0" to "1".

16. The signal receiver of claim 15, wherein, during a normal operation, the reference voltage generation circuit:
adjusts the level of the first reference voltage using the offset of the first preliminary reception circuit; and
adjusts the level of the second reference voltage using the offset of the second preliminary reception circuit.

17. The signal receiver of claim 16, wherein the reference voltage generation circuit adjusts the level of the first reference voltage and the level of the second reference voltage further using a reference voltage setting code and a difference code.

18. The signal receiver of claim 17, wherein the difference code, during the offset measurement operation of the first preliminary reception circuit and during the offset measurement operation of the second preliminary reception circuit, is set to be greater than the difference code during the normal operation.

19. The signal receiver of claim 15,
wherein the first preliminary reception circuit comprises:
a first comparator suitable for comparing the input signal with the first reference voltage; and
a first latch suitable for generating the first preliminary reception signal by latching an output signal of the first comparator, and
wherein the second preliminary reception circuit comprises:
a second comparator suitable for comparing the input signal with the second reference voltage, and
a second latch suitable for generating the second preliminary reception signal by latching an output signal of the second comparator.

20. The signal receiver of claim 19, wherein the reception circuit comprises:
a selection circuit suitable for selecting one of the first preliminary reception signal and the second preliminary reception signal in response to the voltage level of the reception signal corresponding to the input signal received in the previous cycle; and
a third latch suitable for generating the reception signal by latching the signal selected by the selection circuit.

21. The signal receiver of claim 20,
wherein the first latch and the second latch operate in synchronization with a first clock, and
wherein the third latch operates in synchronization with a second clock having a phase lagging behind a phase of the first clock.

22. The signal receiver of claim 14, wherein the first reference voltage has a higher voltage level than the second reference voltage.

23. The signal receiver of claim 15, wherein:
during the offset measurement operation of the first preliminary reception circuit and during the offset measurement operation of the second preliminary reception circuit, the first reference voltage and the second reference voltage have an identical voltage level, and
during a normal operation, the first reference voltage has a higher voltage level than the second reference voltage.

24. A method for measuring an offset of a signal receiver, the method comprising:
generating a first reference voltage having a first level lower than a voltage level of an input signal;

comparing the input signal with the first reference voltage having the first level and generating a first preliminary reception signal as a result of the comparison;

comparing the input signal with a second reference voltage and generating a second preliminary reception signal as a result of the comparison;

selecting the first preliminary reception signal among the first preliminary reception signal and the second preliminary reception signal and generating a logic level of a reception signal as "1" based on the selected first preliminary reception signal;

generating the first reference voltage having a second level higher than the first level;

comparing the input signal with the first reference voltage having the second level and generating the first preliminary reception signal as a result of the comparison;

comparing the input signal with the second reference voltage and generating the second preliminary reception signal as a result of the comparison;

selecting the first preliminary reception signal among the first preliminary reception signal and the second preliminary reception signal and generating the logic level of the reception signal as "0" based on the selected first preliminary reception signal; and measuring a first offset using the second level and the level of the input signal.

25. The method of claim 24, further comprising:

generating the second reference voltage having a third level higher than the level of the input signal;

comparing the input signal with the second reference voltage of the third level and generating the second preliminary reception signal as a result of the comparison;

comparing the input signal with the first reference voltage and generating the first preliminary reception signal as a result of the comparison;

selecting the second preliminary reception signal among the first preliminary reception signal and the second preliminary reception signal and generating the logic level of the reception signal as "0" based on the selected second preliminary reception signal;

generating the second reference voltage having a fourth level lower than the third level;

comparing the input signal with the second reference voltage of the fourth level and generating the second preliminary reception signal as a result of the comparison;

comparing the input signal with the first reference voltage and generating the first preliminary reception signal as a result of the comparison;

selecting the second preliminary reception signal among the first preliminary reception signal and the second preliminary reception signal and generating the logic level of the reception signal as "1" based on the selected second preliminary reception signal; and measuring a second offset using the fourth level and the level of the input signal.

26. The method of claim 25, wherein the first reference voltage has a higher voltage level than the second reference voltage.

27. A signal receiver comprising:

a first preliminary reception circuit suitable for receiving an input signal and generating a first preliminary reception signal based on a first reference voltage;

a second preliminary reception circuit suitable for receiving the input signal and generating a second preliminary reception signal based on a second reference voltage;

a reception circuit suitable for selectively outputting one of the first preliminary reception signal and the second preliminary reception signal as a reception signal, based on a voltage level of the reception signal corresponding to the input signal received in a previous cycle; and a reference voltage generation circuit suitable for:

generating, during a normal operation, the first and second reference voltage based on a reference voltage setting code, a difference code, a first offset, and a second offset;

measuring, during a first offset measurement operation, the first offset of the first preliminary reception circuit based on a logic level of the reception signal obtained by gradually differentiating a voltage difference between the first reference voltage and the input signal; and measuring, during a second offset measurement operation, the second offset of the second preliminary reception circuit based on a logic level of the reception signal obtained by gradually differentiating a voltage difference between the second reference voltage and the input signal.

* * * * *